United States Patent
Hao et al.

(10) Patent No.: US 8,866,428 B2
(45) Date of Patent: Oct. 21, 2014

(54) METHOD AND APPARATUS FOR THERMALLY MONITORING A PERMANENT MAGNET ELECTRIC MOTOR

(75) Inventors: Lei Hao, Troy, MI (US); Yilu Zhang, Northville, MI (US); Siwei Cheng, Atlanta, GA (US)

(73) Assignee: GM Global Technology Operations LLC, Detroit, MI (US)

( * ) Notice: Subject to any disclaimer, the term of this patent is extended or adjusted under 35 U.S.C. 154(b) by 202 days.

(21) Appl. No.: 13/151,568

(22) Filed: Jun. 2, 2011

(65) Prior Publication Data

US 2012/0306422 A1 Dec. 6, 2012

(51) Int. Cl.
- *H02P 7/00* (2006.01)
- *H02P 29/02* (2006.01)
- *H02P 29/00* (2006.01)
- *G01K 7/22* (2006.01)
- *G01R 31/34* (2006.01)

(52) U.S. Cl.
CPC ........ *H02P 29/0055* (2013.01); *G01K 2205/00* (2013.01); *H02P 29/028* (2013.01); *G01K 7/22* (2013.01); *G01R 31/343* (2013.01); *G01K 2217/00* (2013.01)
USPC ........... 318/490; 318/783; 318/634; 318/641; 318/400.08; 318/471

(58) Field of Classification Search
USPC ............ 318/634, 471, 472, 641, 400.08, 783, 318/490
See application file for complete search history.

(56) References Cited

U.S. PATENT DOCUMENTS

| | | | |
|---|---|---|---|
| 6,621,291 B2 | 9/2003 | Lee et al. | |
| 6,636,012 B2 * | 10/2003 | Royak et al. | 318/727 |
| 2010/0156338 A1 * | 6/2010 | Lu et al. | 318/798 |
| 2011/0050140 A1 * | 3/2011 | Sakai et al. | 318/400.36 |
| 2011/0084638 A1 * | 4/2011 | Patel et al. | 318/400.32 |

FOREIGN PATENT DOCUMENTS

| | | |
|---|---|---|
| WO | 2009/143487 A2 | 11/2009 |
| WO | 2010/086729 A2 | 5/2010 |

OTHER PUBLICATIONS

Zhang, Pinjia;A Remote and Sensorless Stator Winding Resistance Estimation Method for Thermal Protection of Soft-Starter-Connected Induction Machines—IEEE Transactions on Industrial Electronics, vol. 55, No. 10, Oct. 2008.

* cited by examiner

*Primary Examiner* — Eduardo Colon Santana
*Assistant Examiner* — Iftekhar Mustafa

(57) ABSTRACT

A method for determining a temperature of an electric motor including stator windings includes injecting an AC current into a D-axis current of a stator winding at a frequency that is synchronized with a control frequency of the electric motor, determining a DC-phase current, determining a resistance of the stator winding corresponding to the DC-phase current and an applied voltage, and determining a temperature of the electric motor as a function of the resistance of the stator winding.

14 Claims, 2 Drawing Sheets

METHOD AND APPARATUS FOR THERMALLY MONITORING A PERMANENT MAGNET ELECTRIC MOTOR

TECHNICAL FIELD

This disclosure is related to electric motors and thermal monitoring thereof.

BACKGROUND

The statements in this section merely provide background information related to the present disclosure and may not constitute prior art.

Known electric motors include permanent magnet electric motors and other induction motors that transform electric power to mechanical torque. Permanent magnet electric motors may be multiphase interior permanent magnet (IPM) electric motors that include permanent magnets buried within a rotor core and aligned longitudinally with an axis of rotation. Known stators include an annular stator core and a plurality of electrical windings. Known stator cores include a plurality of radial inwardly projecting tooth elements that are parallel to a longitudinal axis of the electric motor and define an inner circumference of the stator. Contiguous radial inwardly projecting tooth elements form radially-oriented longitudinal slots. Electrical windings are fabricated from strands of suitable conductive material, e.g., copper or aluminum, and are woven or otherwise arranged into coil groups that are inserted into the radially-oriented slots between the tooth elements. Electrical windings are arranged electrically in series in circular fashion around the circumference of the stator core, with each electrical winding associated with a single phase of the electric motor. Each coil group of the electrical windings provides a single pole of a single phase of motor operation. The quantity of radially-oriented slots in the stator core is determined based upon the quantity of phases and poles of the electrical wiring windings for the electric motor. Thus, a three-phase, two-pole motor will have electrical windings that are configured as six coil groups. Current flow through the electrical windings is used to generate rotating magnetic fields that act on a rotor to induce torque on a shaft of the rotor.

Known rotors for permanent magnet electric motors include a rotor core attached to a rotating shaft that defines an axis of rotation, and have a plurality of rotor magnets positioned around the circumference near an outer surface of the rotor core, with each rotor magnet aligned longitudinally with the axis of rotation.

Known electric motors include an air gap between tooth elements of a stator and an outer surface of a rotor. An air gap is a design feature that physically separates the rotor and stator part to accommodate manufacturing tolerances and facilitate assembly, and address other known factors. An air gap is preferably minimized, as an increased air gap correlates to reduced magnetic flux and associated reduced output torque of the electric motor.

When electric current flows through the stator windings, a magnetic field is induced along the electrical windings to act upon the rotor magnets of the rotor element. The magnetic field induces torque on the rotating shaft of the rotor. When the magnetic field induces sufficient torque to overcome bearing friction and any induced torque load on the shaft, the rotor rotates the shaft.

Design of electric motors includes factors related to magnetics, mechanics, thermodynamics, electronics, acoustics, and material sciences. It is known that performance requirements, packaging constraints and costs impose constraints on motor design that affect design features. Known performance requirements include maximum motor torque output, torque ripple, and cogging torque, which affect noise, vibration, and harshness performance of the electric motor. Known permanent magnet electric motors have flux distribution due to the permanent magnets and the armature magneto-motive forces that is non-sinusoidal with respect to the angular rotor position.

Permanent magnet electric motors including IPM motors may be used in vehicle propulsion applications because of their high efficiency and high power density. An electric motor may be sized according to expected load profiles, e.g., duty cycles of the vehicle and overall efficiency and power loss. Operating temperature of permanent magnet electric motor, e.g., winding temperature is dependent upon an actual operating load and duty cycle. In an operating regime including prolonged operation at peak output power, an electric motor may overheat. Overheating may accelerate aging and deterioration of insulation on stator windings and demagnetize permanent magnets, thus degrading motor performance and reducing electric motor life.

Known IPM motors may monitor winding temperature using direct measurement systems, e.g., by installing thermocouples or thermistor devices within stator windings. Temperature measurement systems add components, increase wiring harness complexity and require signal monitoring hardware and software. Known thermal models may use motor operating parameters to estimate winding temperature and have associated estimation errors.

SUMMARY

A method for determining a temperature of an electric motor including stator windings includes injecting an AC current into a D-axis current of a stator winding at a frequency that is synchronized with a control frequency of the electric motor, determining a DC-phase current, determining a resistance of the stator winding corresponding to the DC-phase current and an applied voltage, and determining a temperature of the electric motor as a function of the resistance of the stator winding.

BRIEF DESCRIPTION OF THE DRAWINGS

One or more embodiments will now be described, by way of example, with reference to the accompanying drawings, in which.

DETAILED DESCRIPTION

Figure 1:
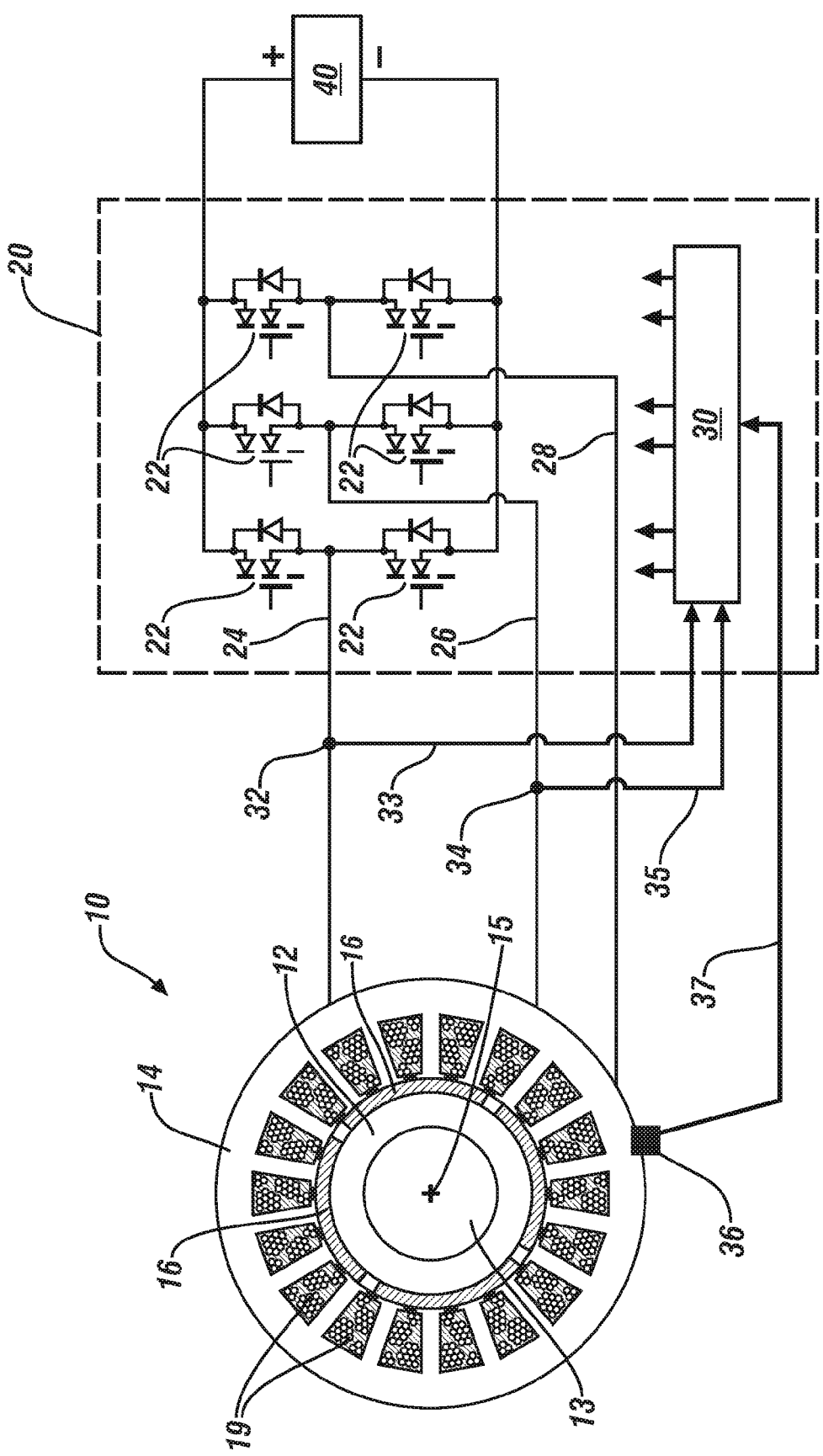
FIG. 1 schematically shows a sectional view of an electric motor electrically connected to an inverter module that is electrically connected to a high-voltage DC power supply in accordance with the disclosure.

Referring now to the drawings, wherein the showings are for the purpose of illustrating certain exemplary embodiments only and not for the purpose of limiting the same, FIG. 1 schematically shows a sectional view of a permanent magnet electric motor 10 electrically connected to an inverter module 20 that is electrically connected to a high-voltage DC power supply 40. The permanent magnet electric motor 10 includes a rotor 12 mounted on a shaft 13. A center line of the shaft 13 defines a longitudinal axis that is an axis of rotation 15 of the rotor 20. The rotor 12 includes a plurality of permanent magnets 16 mounted or otherwise attached at or near an external surface thereof. The rotor 12 is inserted into a coaxial hollow cylindrical stator 14. The stator 14 includes a plurality of stator windings 19 arranged in a multiphase manner. The permanent magnet electric motor 10 includes a case having end caps, and the shaft 13 of the rotor 12 is rotatably mounted on bearing surfaces of the end caps. The cross-sectional view of the permanent magnet electric motor 10 is shown orthogonal to the axis of rotation 15 of the rotor 12. A rotational position sensor 36 is suitably mounted to monitor an angular position 37 of the rotor 12 to determine rotational speed thereof. It is appreciated that the permanent magnet electric motor 10 be replaced with an induction machine, a wound synchronous machine, or another suitable electric motor with similar effect.

The inverter module 20 includes a plurality of gate drives 22 and an associated control module 30. Pairs of the gate drives 22 correspond to selected portions of the stator windings 19 of the permanent magnet electric motor 10 and are arranged in a suitable manner to control individual phases thereof. As shown, there are six gate drives 22 arranged in three pairs to control flow of electric power to the permanent magnet electric motor 10 in three phases. The gate drives 22 may include IGBTs or other suitable devices.

The inverter module 20 electrically connects to the permanent magnet electric motor 10 using a quantity of electrical leads corresponding to the plurality of stator windings 19, including electrical leads 24, 26, and 28 corresponding to phases A, B, and C. Current monitoring sensors 32 and 34 are configured to monitor electric current through leads 24 and 26 for phases A and B, respectively, thus generating corresponding current signals 33 and 35 that are monitored by the control module 30.

In operation, the control module 30 sequentially activates the gate drives 22 to transfer electric current from the high-voltage DC power supply 40 to one of the phases of the stator windings 19. The electric current induces a magnetic field in the stator windings 19 that acts on the permanent magnets 16 and induces rotation of the rotor 12 on the shaft 13 about the axis of rotation 15. The angular position 37 of the rotor 12 is monitored with the rotational position sensor 36 and current flows 33 and 35 are monitored with the current monitoring sensors 32 and 34. The controller 20 controls timing of activation of the gate drives 22 to control rotational speed and torque output of the permanent magnet electric motor 10.

Figure 2:
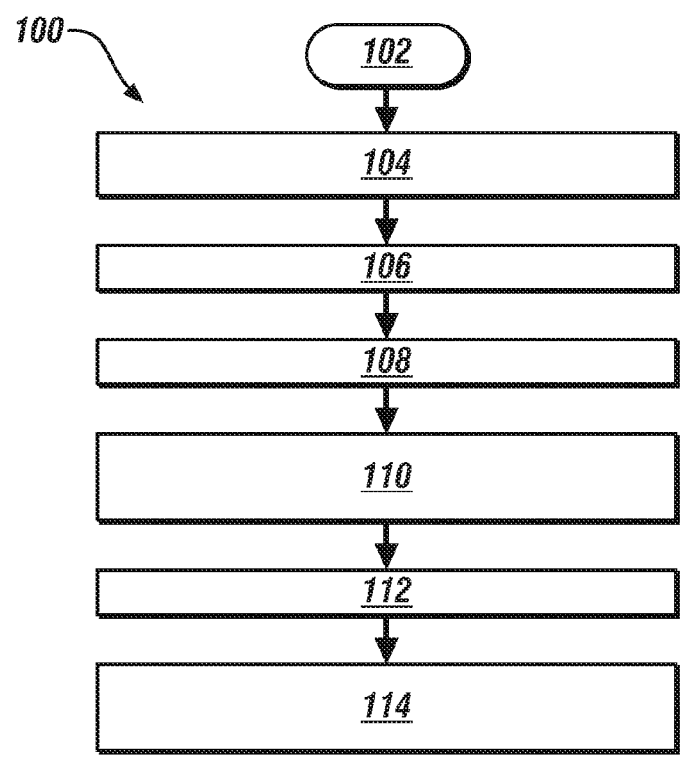
FIG. 2 is a flowchart of a process for monitoring a temperature of a permanent magnet electric motor in accordance with the disclosure.

FIG. 2 illustrates a process 100 in flowchart form for monitoring temperature of a permanent magnet electric motor. The process 100 is described with reference to the permanent magnet electric motor 10 and inverter module 20 described with reference to FIG. 1. As such, it is appreciated that the process 100 when executed as described herein is able to monitor temperature of the permanent magnet electric motor 10 using only an electrical wiring configuration that may be employed to control the permanent magnet electric motor 10 without requiring additional hardware such as a temperature sensor and associated wiring harness and signal processing hardware.

The process 100 includes injecting an AC current into a D-axis current of the electric motor 10 at a frequency that is synchronized with a control frequency of the electric motor 10. Injecting AC current into the D-axis current of the permanent magnet electric motor 10 is equivalent to injecting a DC-phase current and a second harmonic current into machine phase currents. Corresponding DC outputs are monitored to determine a DC resistance of the stator windings 19 of the permanent magnet electric motor 10. The DC resistance correlates to temperature of the stator windings.

The process 100 is preferably periodically iteratively executed by the controller 30 to estimate temperature of the permanent magnet electric motor 10. Due to thermal inertia and heat generation, a thermal time constant of the permanent magnet electric motor 10 may be in the order of magnitude of seconds or minutes. Thus, in one embodiment, periodic execution of the process 100 occurs once every 10 seconds. Other suitable time periods for execution of the process 100 may be determined.

Table 1 is provided as a key associated with the process 100 described with reference to FIG. 2, wherein the numerically labeled blocks and the corresponding functions are set forth as follows.

TABLE 1

FIG. 2

| BLOCK | BLOCK CONTENTS |
|---|---|
| 102 | Start |
| 104 | Inject AC current into D-axis reference current |
| 106 | Execute current control loop to control machine D-axis and Q-axis currents |
| 108 | Measure phase current and determine applied voltage |
| 110 | Calculate DC-phase current and DC-phase voltage by filtering the measured phase current and applied voltage from current control loop |
| 112 | Calculate DC resistance of the single phase of the stator |
| 114 | Determine stator winding temperature corresponding to DC resistance of the stator and temperature coefficient of winding material |

The process 100 is periodically executed (102) by injecting an AC current into the D-axis current of the permanent magnet electric motor 10. As is appreciated, the D-axis and the Q-axis are virtual axes of an electric machine after a synchronous A-B-C to D-Q transformation is applied to a machine three-phase axis. The AC current is injected at a frequency that is synchronous to the control frequency of the permanent magnet electric motor 10 (104). The magnitude of the AC current is determined in relation to accuracy of the current monitoring sensors 32 and 34 and is preferably a small magnitude as compared to the reference phase currents which are employed to control the torque. Preferably the controller 30 is configured to control activation of a selected pair of the gate drivers 22 to control machine speed and torque as well as to inject the AC current into the D-axis current of the permanent magnet electric motor 10 synchronous to the control frequency for operating the permanent magnet electric motor 10.

Permanent magnet electric motors are preferably operated such that core material is fully utilized. Hence, flux density may be at or near a saturation level in the core materials during ongoing operation. Any variation in the Q-axis current as a result of a DC current injection may change saturation levels of the permanent magnet electric motor, influencing the accuracy of any stator resistance estimation and degrading the dynamic performance of the permanent magnet electric motor thus increasing core losses.

Directly injecting a DC current ($I_{de}$) into three-phase windings, as shown in Eqs. 1, 2, and 3 is equivalent to injecting AC current, i.e., $\Delta I_d$ and $\Delta I_q$ in the D-axis and Q-axis windings, respectively, after a synchronous A-B-C to D-Q transformation, as follows in Eqs. 4 and 5.

$$I_a \rightarrow I_a + I_{dc} \quad [1]$$

$$I_b \rightarrow I_b - \frac{1}{2}I_{dc} \quad [2]$$

$$I_c \rightarrow I_c - \frac{1}{2}I_{dc} \quad [3]$$

$$\Delta I_q = I_{dc}\cos\theta \quad [4]$$

$$\Delta I_d = I_{dc}\sin\theta \quad [5]$$

Injecting the AC current at the synchronous frequency into only the D-axis reference current of the permanent magnet electric motor 10 but not into the Q-axis reference current may be shown as equivalent to injecting DC current into the three-phase windings. Injecting the AC current at the synchronous frequency into only the D-axis reference current of the permanent magnet electric motor 10 may be expressed as follows.

$$\Delta I_q = 0 \quad [6]$$

$$\Delta I_d = 2I_{dc}\sin\theta \quad [7]$$

After reference frame transformation, the relationship of Eqs. 6 and 7 may be equivalent to injecting current into the permanent magnet electric motor 10 which is expressed as follows, with $I_a$, $I_b$, and $I_c$ indicating DC currents associated with phases A, B, and C, respectively as follows.

$$I_a = I_{dc} - I_{dc}\cos(2\theta) \quad [8]$$

$$I_b = -\frac{1}{2}I_{dc} - I_{dc}\cos\left(2\theta - \frac{4}{3}\pi\right) \quad [9]$$

$$I_c = -\frac{1}{2}I_{dc} - I_{dc}\cos\left(2\theta + \frac{4}{3}\pi\right) \quad [10]$$

Eqs. 8, 9, and 10 indicate that injecting DC current, i.e., injecting the DC current to the stator windings 19 of the permanent magnet electric motor 10, is achievable with some additional second-order harmonic current by injecting the equivalent AC current into only the D-axis. The second-order harmonic current may induce some second- and fourth-order voltage harmonics, but it will not affect the amplitude of the DC voltage output from the high-voltage DC power supply 40. Any induced variation in the D-axis reference current may only slightly affect saturation levels of the permanent magnet electric motor 10 because the air-gap along the D-axis in the permanent magnet electric motor 10 is relatively large.

Electromagnetic torque T generated by the permanent magnet electric motor 10 may be expressed in terms of motor flux $\lambda_m$, D-axis and Q-axis inductances $L_d$ and $L_q$ respectively, and D-axis and Q-axis currents $I_d$ and $I_q$ respectively, as follows.

$$T = \frac{3}{2}\frac{P}{2}(\lambda_m I_q + (L_d - L_q)I_q I_d) \quad [11]$$

The D-axis current $I_d$ pulsates at the stator frequency when the DC current is injected to the stator windings of the permanent magnet electric motor. Therefore, the electromagnetic torque may induce torque oscillation at the stator frequency. It is appreciated that a greater DC current injection results in greater accuracy of the stator resistance estimation, albeit with a larger torque oscillation. An acceptable level of torque oscillation may be weighed against accuracy of the stator resistance estimation and associated winding temperature estimation. As previously discussed, the thermal time constant for a permanent magnet electric motor is in the order of seconds or minutes, thus the estimation of the stator resistance may be performed accordingly to minimize the effects of torque oscillation.

The current control loop is executed coincident with AC current injection at the synchronous frequency into only the D-axis reference current of the permanent magnet electric motor 10 (106). The phase current is measured, preferably using the measured phase current signals 33 and 35 (108). The DC portion of the phase current is calculated by monitoring and filtering the measured phase current signals 33 and 35, or alternatively, monitoring other existing sensing devices and systems of the permanent magnet electric motor 10.

The DC portion of the phase voltage is preferably calculated by monitoring and filtering the applied voltage of the high-voltage DC power supply 40 that is output from the current control loop (110).

A DC resistance of the stator windings 19 may be calculated as a ratio of the DC portion of the phase voltage and the DC portion of the phase current (112).

A temperature of the stator windings 19 may be estimated or otherwise determined in relation to the DC resistance of the stator windings 19 and a temperature coefficient of the winding material (114). It is appreciated that the resistivity of electrically conductive material used in stator windings, e.g., copper, changes in a predictable manner with a change in temperature relative to a reference temperature $T_o$. This may be expressed as follows.

$$R(T) = R_0[1 + \alpha(T - T_0)] \quad [12]$$

wherein R(T) is the resistance at a selected temperature T,
$R_0$ represents a reference resistance at the reference temperature $T_0$, and
$\alpha$ is the temperature coefficient of the electrically conductive material.

By way of example, the temperature coefficient of copper is $\alpha = 0.004041$. It is appreciated that the relationship of Eq. 12 may be implemented in the control module 30 as either or both an executable equation and a searchable table as a function of the selected temperature.

Stator winding temperature Tsw may be determined in terms of the determined stator resistance R in relation to the reference resistance $R_0$ as follows.

$$Tsw = T_0 + \frac{R - R_0}{\alpha R_0} \quad [13]$$

Thus, it is appreciated that stator resistance of the permanent magnet electric motor directly relates to the stator winding temperature Tsw.

Figure 3:
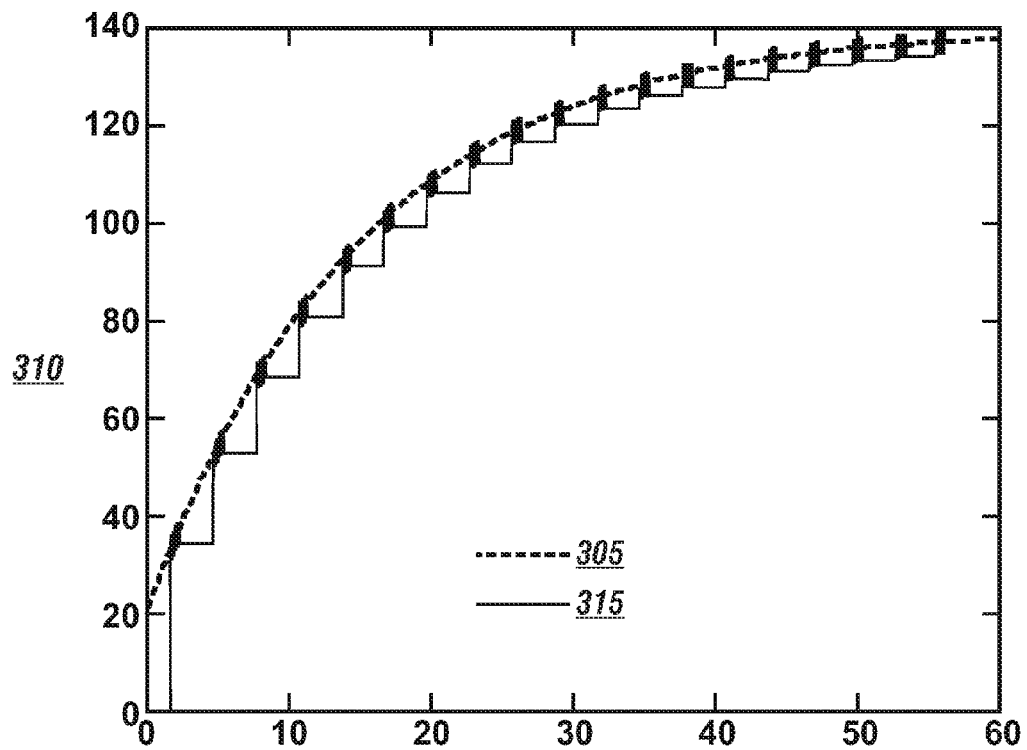
FIG. 3 is a datagraph of temperature and elapsed time to depict a measured stator temperature and a corresponding estimated stator temperature as a function of elapsed operating time in accordance with the disclosure.

FIG. 3 shows temperature (° C.) 310 on the y-axis corresponding to time (sec) 320 on the x-axis, and depicts a measured stator temperature 305 and a corresponding estimated stator temperature 315 as a function of elapsed operating time. The measured stator temperature 305 was determined using a suitable temperature monitoring system, and the estimated stator temperature 315 was determined as described herein using an embodiment of the process 100 described with reference to FIG. 2. Estimating the stator temperature 315 included periodically injecting an AC current into a D-axis current at a rate of about once every 3 seconds. As shown in FIG. 3, the estimated stator temperature 315 corresponds within 4° C. of the measured stator temperature 305 when the DC current is periodically injected.

It is appreciated that injecting an AC current into a D-axis current may induce torque oscillation. In one embodiment, the oscillation of $I_d$ correlated to injecting the AC current into the D-axis current was 11.53%, and the oscillation of the $I_q$ current was 0.33%. The corresponding oscillation of electromagnetic torque was 4.53% for one specific operating condition. The duration of the torque oscillation was less than 500 ms. It is appreciated that driveline damping and inertia may minimize transfer of torque oscillation to rotational speed oscillation. However, it is preferable to avoid injecting the AC current into the D-axis current at a motor rotating frequency that is near resonance frequencies of the powertrain system, the driveline, and the vehicle.

Control module, module, control, controller, control unit, processor and similar terms mean any suitable one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other suitable components to provide the described functionality. Software, firmware, programs, instructions, routines, code, algorithms and similar terms mean any controller executable instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 3.125, 6.25, 12.5, 25 and 100 milliseconds during ongoing engine and vehicle operation. Alternatively, routines may be executed in response to occurrence of an event.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A method for determining a temperature of an electric motor including stator windings, comprising:
periodically injecting an AC current into a D-axis current of a stator winding at a frequency that is synchronized with a control frequency of the electric motor during motor torque generation said periodic injection being a thermal time constant of the electric motor;
determining a DC-phase current;
determining a resistance of the stator winding corresponding to the DC-phase current and an applied voltage; and
determining a temperature of the electric motor as a function of the resistance of the stator winding.

2. The method of claim 1, wherein the AC current is only injected into the D-axis current of the stator winding.

3. The method of claim 1, wherein the AC current is not injected into a Q-axis current of the stator winding.

4. The method of claim 1, wherein the temperature of the electric motor is further determined as a function of a temperature coefficient of material of the stator windings.

5. The method of claim 1, wherein determining the DC-phase current comprises monitoring and filtering a measured phase current of the electric motor.

6. The method of claim 1, wherein the applied voltage is determined by monitoring a voltage of a high-voltage DC power supply electrically coupled to an inverter module configured to operate the electric motor.

7. A method for determining a temperature of an electric motor including stator windings, comprising:
periodically injecting an AC current into a D-axis current of a stator winding at a frequency that is synchronized with a control frequency of the electric motor during motor torque generation, said periodic injection being a thermal time constant of the electric motor;
monitoring a phase current of the electric motor to determine a DC-phase current;
determining an applied voltage;
determining a resistance of the stator winding corresponding to the DC-phase current and the applied voltage; and
determining a temperature of the electric motor as a function of the resistance of the stator winding.

8. The method of claim 7, wherein the AC current is only injected into the D-axis current of the stator winding.

9. The method of claim 8, wherein the AC current is not injected into the a Q-axis current of the stator winding.

10. The method of claim 7, wherein the temperature of the electric motor is further determined as a function of a temperature coefficient of material of the stator windings.

11. The method of claim 7, wherein determining the DC-phase current comprises monitoring a measured phase current of the electric motor.

12. The method of claim 7, wherein determining the applied voltage comprises monitoring a voltage of a high-voltage DC power supply electrically coupled to an inverter module configured to operate the electric motor.

13. A method for determining a temperature of an electric motor including stator windings, comprising:
periodically injecting an AC current into only a D-axis current in synchronicity with a current control frequency of the electric motor during motor torque generation and not injecting an AC current into a Q-axis current said periodic injection being a thermal time constant of the electric motor;
determining a corresponding DC-phase current;
calculating a resistance of the stator winding corresponding to the DC-phase current and an applied voltage; and
determining a temperature of the electric motor as a function of the resistance of the stator winding.

14. The method of claim 13, wherein determining the corresponding DC-phase current comprises monitoring a measured phase current of the electric.

* * * * *